(12) United States Patent
Tutt et al.

(10) Patent No.: US 7,745,101 B2
(45) Date of Patent: Jun. 29, 2010

(54) NANOPARTICLE PATTERNING PROCESS

(75) Inventors: Lee W. Tutt, Webster, NY (US); Therese M. Feller, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 874 days.

(21) Appl. No.: 11/421,894

(22) Filed: Jun. 2, 2006

(65) Prior Publication Data

US 2007/0281249 A1 Dec. 6, 2007

(51) Int. Cl.
*H01L 21/00* (2006.01)
*G03F 7/00* (2006.01)

(52) U.S. Cl. .................. 430/315; 430/311; 430/324; 430/318; 430/330

(58) Field of Classification Search .......... 430/311, 430/315, 318, 324; 427/498, 512, 466, 511
See application file for complete search history.

(56) References Cited

U.S. PATENT DOCUMENTS

| | | | |
|---|---|---|---|
| 3,775,117 A | 11/1973 | Hoffman et al. | |
| 4,686,168 A | 8/1987 | Fujii et al. | |
| 4,973,572 A | 11/1990 | DeBoer | |
| 5,359,101 A | 10/1994 | Woods et al. | |
| 5,468,591 A | 11/1995 | Pearce et al. | |
| 5,578,416 A | 11/1996 | Tutt | |
| 5,858,607 A | 1/1999 | Burberry et al. | |
| 5,891,602 A | 4/1999 | Neumann | |
| 6,018,413 A * | 1/2000 | Oka | 359/326 |
| 6,165,671 A | 12/2000 | Weidner et al. | |
| 6,695,029 B2 | 2/2004 | Phillips et al. | |
| 6,763,585 B2 * | 7/2004 | Suzuki | 29/877 |
| 6,787,283 B1 | 9/2004 | Aoai et al. | |
| 2003/0119282 A1* | 6/2003 | Yamazaki | 438/478 |
| 2004/0079195 A1 | 4/2004 | Perry et al. | |
| 2005/0078158 A1 | 4/2005 | Magdassi et al. | |
| 2005/0266172 A1 | 12/2005 | Kay et al. | |

FOREIGN PATENT DOCUMENTS

| | | |
|---|---|---|
| EP | 0 343 603 | 5/1989 |
| EP | 1 510 861 | 3/2005 |
| GB | 1 247 973 | 9/1971 |
| JP | 60-004879 | 1/1985 |
| JP | 60-141644 | 7/1985 |
| JP | 60-176949 | 9/1985 |

(Continued)

OTHER PUBLICATIONS

Molesa et al.; High-quality inkjet-printed multilevel interconnects and inductive components on plastic for ultra-low-cost RFID applications; University of California, Berkley.

(Continued)

*Primary Examiner*—Thorl Chea
(74) *Attorney, Agent, or Firm*—Nelson Adrian Blish

(57) ABSTRACT

A method of making a metallic pattern (250) comprises: depositing a layer of photoresist (130) on a substrate (110); forming a pattern on the photoresist; depositing a layer of metal nanoparticles (190) on the photoresist and pattern; removing the photoresist and overlying metal nanoparticles on the photoresist; and sintering the remaining nanoparticles to form a metallic pattern.

14 Claims, 5 Drawing Sheets

FOREIGN PATENT DOCUMENTS

| | | |
|---|---|---|
| JP | 7-56341 | 7/1995 |
| WO | 2005/109097 | 11/2005 |

OTHER PUBLICATIONS

Bieri et al.; Microstructuring by printing and laser curing of nanoparticle solutions Applied Physics Letters, vol. 82, No. 20, May 19, 2003, pp. 3529-3531.

Chung et al.; Conductor microstructures by laser curing of printed gold nanoparticle ink; Applied Physics Letters, vol. 84, No. 5, Feb. 2, 2004, pp. 801-803.

"Infrared Absorbing Dyes" (ed. Masaru Matsuoka), Plenum Press, 1990.

Helbert et al.; Radiation Degradation of a-Substituted Acrylate Polymers and Copolymers; Journal of Applied Polymer Science, vol. 21, 1977, pp. 797-807.

Hogan et al.; Laser Photoablation of Spin-on-Glass and Poly(Ethyl Cyanoacrylate) Photoresist; Applied Surface Science 36 (1989), pp. 343-349.

Woods et al.; Vapour deposition of poly(alkyl-2-cyanacrylate) resist coatings: a new electron-beam/deep-ultra-violet photoresist technology, Polymer 1989, vol. 30, pp. 1091-1098.

\* cited by examiner

NANOPARTICLE PATTERNING PROCESS

CROSS REFERENCE TO RELATED APPLICATIONS

Reference is made to commonly-assigned copending U.S. patent application Ser. No. 10/881,301, filed Jun. 30, 2004, entitled FORMING ELECTRICAL CONDUCTORS ON A SUBSTRATE, by Yang et al.; and U.S. patent application Ser. No. 11/420,817, filed May 30, 2006, entitled LASER PATTERNING RESIST, by Phillips et al., the disclosures of which are incorporated herein.

FIELD OF THE INVENTION

The invention relates in general to forming a pattern of conductors on a substrate and in particular to forming conductors on a substrate by coating and sintering metal nanoparticles in a pattern on the substrate.

BACKGROUND OF THE INVENTION

It is often necessary to print large area electrical circuits with conductors having at least one lateral dimension of 1-1000 microns. One process for accomplishing this type of circuit printing is using vacuum deposition. This method, however, is a high-cost operation and is usually only suitable for batch processing.

Another method of constructing electrical circuits is inkjet printing of patterns using metal nanoparticles to form conductors. This process is discussed in S. Molesa et al.; "High-quality inkjet-printed multilevel interconnects and inductive components on plastic for ultra-low-cost RFID applications" University of California, Berkeley. Some problems associated with this technique are that it is substrate dependent, it is difficult to achieve lateral dimensions of less than 100 microns, and the particles must be annealed by bulk heating, which can cause substrate deformation. Another problem with inkjet deposition is that it often requires multiple passes to deposit the proper amount of material, which reduces throughput.

Attempts to solve the bulk-heating problem, shown in the following two references, involve using high-powered lasers to anneal nanoparticles. N. R. Bieri et al.; "Microstructuring by printing and laser curing of nanoparticle solutions" Applied Physics Letters, Volume 82, Number 20, May 19, 2003, pages 3529-3531; and J. Chung et al.; "Conductor microstructures by laser curing of printed gold nanoparticle ink" Applied Physics Letters, Volume 84, Number 5, Feb. 2, 2004, pages 801-803.

Lithographic patterning techniques have been employed in conventional fabrication of microelectronic devices, including thin film transistors (TFT) arrays for flat panel application. Conventional photoresist lithographic techniques applied to microfabrication have proved capable of defining structures and forming regions of material on a substrate to within dimensions of about 100 nm.

Based on a printing model, the lithographic process forms a pattern of areas that are either receptive or repellent (non-receptive) to a coating (such as ink) or to some other treatment. Conventional photolithography requires a small number of basic steps, with variations according to the materials used and other factors. A typical sequence is as follows:

(i) wet coating of a positive-working or negative-working photoresist (such as by spin-coating);
 (ii) prebake of the photoresist;
 (iii) exposure by some form of electromagnetic radiation through an overlay mask using an optical mask aligner to form the pattern;
 (iv) curing of the masked pattern, such as by postbake; and
 (v) removal of the uncured portion, using a liquid to form a pattern.

Following subsequent coating or treatment of the surface, the protective photoresist pattern can then itself be removed.

Steps (i)-(v) may be performed in air, such as in a clean room environment, and are typically performed using separate pieces of equipment. Alternately, one or more steps, such as coating deposition, may be performed in vacuum. Because of the very different nature of processes carried out in each of these steps, it would not be readily feasible to combine steps (i)-(v) in any type of automated, continuous fabrication system or apparatus.

Considerable effort has been expended to improve upon conventional methods as listed in steps (i)-(v) above in order to achieve better dimensional resolution, lower cost, and eliminate the use of chemicals such as etchants which may interact with layers previously applied.

As is well known to those skilled in the microlithographic art, conventional photoresist materials follow a "reciprocity law," responding to the total exposure received, the integral of illumination over time. Conventional photoresists are typically exposed with light in the UV portion of the spectrum, where photon energy is particularly high. Examples of photoresists used microfabrication of semiconductor components are given in U.S. Pat. No. 6,787,283 (Aoai et al.).

Additional advantages to conventional process described above are provided by e-beam and X-Ray lithography in that they provide a partial reduction of chemical processing, and while X-Ray lithography still requires the use of masks, e-beams can be used to write patterns in a resist directly without a mask. High energy radiation sufficient to cause bond breaking in organic materials causes chain scission, or depolymerization, in a coated resist such that it can be removed in the image area with solvents that will not remove the non-radiated areas. E-beams, when used as a direct pattern writing device, suffer from low throughput due to long scan times as a result of the serial limitation of a single beam exposure, and are thus limited to low volume manufacture. E-beams are used primarily in the microfabrication industry to manufacture masks for conventional processes due to their sub-micron high resolution capability.

Another improvement for metal patterning is the lift-off process, which is well known in the art. This process avoids the need for an etchant but at the cost of complexity. In this process a patterned resist layer is formed with an overhang. The patterned material is then subject to evaporation or sputtering of the desired material to be patterned. The overhangs will shadow edge regions of the resist assuming the evaporation or sputtering process is approximately collimated. This shadowed region acts as breaks in the deposited material.

Application of a resist solvent removes the resist allowing the overlying deposited material to be removed. The breaks allow the material to separate, and allows the solvent to enter and dissolve the resist.

There is a need for a process which avoids the complexity of forming overhangs, does not require a collimated deposition process and does not require a vacuum system.

A further improvement is provided by direct ablation of a resist with a high energy laser at wavelengths less than 400 nm with energies sufficient to cause resist bond breaking, volatilization, and material evacuation of the resist in the irradiated areas, thus making the solvent development step unnecessary. However, the laser systems for direct UV ablation are quite expensive, pulse, difficult to maintain, and suffer from low throughput due to their single beam limitations. Large area excimer lasers solve that deficiency, but they suffer from the requirement of a mask to form the pattern.

Therefore, a need exists for a method of direct writing, or maskless lithography that allows for the use a less expensive and versatile class of laser directed radiation, specifically the solid state IR diode lasers. IR diode lasers offer the advantages of cost, availability, reliability, and lifetime, and are used widely in the communications industry, in a variety of electronic devices such as CD and DVD writers and players, and in the graphic and reprographic arts including digital color printers, laser thermal platewriters, imagesetters, and proofers. In addition, the individual lasers can be joined in an array of up to almost one hundred or more separately modulated lasers dramatically increasing throughput compared to single beam devices. Alternatively, the light can be conjoined from several laser sources into a single bar laser fitted with a segmented light gate modulator of between 200 to up to 1000 separate addressable channels of individually controlled beams. The beam dimensions are limited only by the wavelength of the light they deliver, and can produce spots as small as 2 microns in the array direction as defined by the spatial light modulator. Examples of commercial laser systems with such capability are the Kodak Newsetter and the Creo Trendsetter plate-writer-proofer. Feature resolution of 2 microns is therefore possible with such diode laser array systems, which is more than sufficient for thin film transistor array backplanes and color filter arrays used in LCD and OLED displays. These IR lasers, as well as YAG lasers that operate in the visible spectrum, suffer from photon energies less than sufficient to break organic bonds and effect direct ablation of resists.

A need exists for a maskless lithographic method for microstructure construction that limits the need for wet chemical etching, in order to reduce cost and to be compatible flexible support substrates and roll to roll continuous manufacture.

SUMMARY OF THE INVENTION

The invention and its objects and advantages will become more apparent in the detailed description of the preferred embodiments presented below. This invention relates to an improved process for manufacture of microstructured devices and especially microelectronic circuitry and thin film transistor and color filter arrays comprising:
1. Coating a first layer of resist material on a substrate.
2. Creating a pattern in the resist material by image wise exposure, and further development if needed.
3. Coating a layer of nanoparticles in a solvent incompatible with the resist material.
4. Removing the resist material with a solvent incompatible with the nanoparticles.
5. Thermally converting the nanoparticles to sinter the nanoparticles.

In a further embodiments, the resist is provided with a light to heat conversion substance that absorbs strongly at the predominant wavelength of the image wise radiation source, whereby the radiation source is a laser that emits light at wavelengths greater than 400 nm, and preferably in the far infrared at wavelengths between 750 and 1100 nm. The pattern is thereby generated Some embodiments of this invention provide for applying the resist layer in a vacuum or from a vapor source.

Therefore, deficiencies of the current methods of creating micro structures and microelectronic devices are corrected by the elements of this invention, by providing a method that can be maskless and includes the use of a less expensive and more versatile class of lasers, the solid state IR diode lasers. It also provides compatibility with standard photolithography processes, has low interaction with other layers by obviating the need for etchants, and can provide high aspect ratio lines.

BRIEF DESCRIPTION OF THE DRAWINGS

While the specification concludes with claims particularly pointing out and distinctly claiming the subject matter of the present invention, it is believed that the invention will be better understood from the following description when taken in conjunction with the accompanying drawings, wherein:

DETAILED DESCRIPTION OF THE INVENTION

The present invention will be directed in particular to elements forming part of, or in cooperation more directly with the method in accordance with the present invention. The present invention will be directed to particular elements forming part of, or in cooperation with the method. It is to be understood that elements not specifically shown or described may take various forms well known to those skilled in the art.

Patterning of metals is a crucial process for any electronic device. The wiring interconnects must be narrow with good conductivity, good edge profile, uniform, low defect rate, and be processable with little interaction with other layers.

Figure 1:
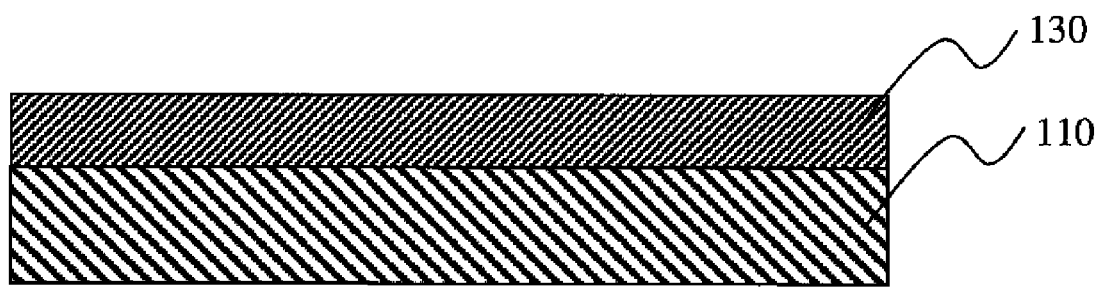
FIG. 1 is a cross section side view showing a thin resist layer on a substrate.

Referring to FIG. 1, a substrate 110 is coated with a layer of thin resist 130 by any of several methods practiced in the microfabrication industry, including but not limited to spin coating, spray coating, hopper coating, meyer rod coating, gravure coating, offset printing, flexography, inkjet coating, dip coating, supercritical $CO_2$, vapor deposition and plasma vacuum deposition.

The substrate 110 could be any material used as a carrier for the thin resist material 130, including glass, a silicon wafer, a metal such as stainless steel, a printed circuit board, and the like. Flexible supports could be used as well, including polyethylene terephthalate, polyethylene, polypropylene, polyethylene naphthalate, polysulphone, polyimides, and the like. Alternatively, the substrate 110 can be any preliminary substructure of a final device, which may include functional layers, registration marks for alignment, as for example the various layers of a thin film transistor array backplane for LCDs or OLED displays.

The choice of thin resist 130 material is dependent on the patterning mechanism. If the patterning is conducted by photolithography, then a standard photoresist can be used. The photoresist can be either a positive type photoresist where the resist is removed in the light exposed regions or can be of the negative type photoresist where the opposite occurs.

In a preferred embodiment the thin resist layer 130 is a photoresist such as a Microposit S1800 resist from Rohm and Haas. This photoresist is a positive type photoresist.

The photoresist is exposed to an optical pattern of intelligence at a wavelength the resist is sensitive to. This pattern can be a two dimensional exposure, as in conventional lithography. In this case a light source is imaged through a mask to expose the photoresist.

In another case the pattern can be in a pointwise exposure. An example of this is a drum print or an x-y stage with a laser of an appropriate wavelength. This laser can be directly modulated via current to the laser or may be modulated by a spatial light modulator such as an acousto-optic modulator.

The pattern is developed by an appropriate developer. In the case of the Microposit resists, a mild base removes the exposed areas, leaving behind photoresist in the unexposed regions. The result is the patterned resist 160 shown in FIG. 2.

In another preferred embodiment, a pattern of intelligence is formed in thin resist layer 130 by thermally induced ablative removal of the resist material by a source of imagewise heat. Preferably, the imagewise heat is provided by a modulated laser beam or an array of such beams. A schematic representation of such a laser patterning device is shown in FIG. 1.

In the preferred embodiment, a laser system consisting of a non-coherent infrared diode laser bar at 808 nm (+/−10 nm) whose beam is divided into 256 separate addressable channels modulated by a spatial light modulator at 5 micron intervals across the beam's width, as described in U.S. Patent Application Publication No. 2005/0266172 (Kay et al.), which is incorporated by reference. The beam intensity distribution in the fast scan direction is a Gaussian whose 1/e2 diameter value is 3.6 micrometers. Peak to peak distance in the fast scan direction was limited by the modulation scheme to 5 microns for the examples of this invention yielding a minimum ablated spot at the film plane of about 5 microns maximum representing 1 pixel in any image rendition. The beam was scanned across the sample by a two axis movable stage that held the sample. Exposure occurred as the fast scan axis movable stage ran at speeds between 1.0 and 0.1 meter per second. The powers available on the laser system were between 11 and 55 milliwatts per channel corresponding to a total exposure range of between 0.22 and 11 J/cm2, although the powers and exposures useful for this invention are not limited to these ranges. The slow scan axis movable stage increments the sample a set distance in preparation for another fast scan motion. This sequence continues until the total desired area is exposed.

The substrate is held against the stage by a vacuum, although those skilled in the art will recognize that many other means exist for affixing the substrate to the stage, for example by clamping, application of pressure, adhesives, with optional heating of the substrate or the like, and including means for accurate placement and registration of the substrate with respect to the ablative pattern. One example of a fixture for this positioning is disclosed in commonly-assigned U.S. Pat. No. 6,695,029 (Phillips et al.), the disclosure of which is hereby incorporated by reference. It is preferred that transfer take place under powers available were between 11 and 55 milliwatts per channel corresponding to a total exposure range of between 0.4 and 11 J/cm2. The movable stage can support a substrate oriented either with the resist side face towards or away from the laser source when working with transparent substrates 110. The ablation debris can be collected either on a coversheet, or preferably, in a vacuum collection device affixed to the laser head. The pattern information is provided by means of a CPU and a RIP capable of processing test patterns or TIF images wherein 1 pixel was assigned a pattern dimension of 5×5 microns.

Any infrared or visible YAG laser system could be used in conjunction with the resist layer 130 of this invention, which is not limited to the laser system described above. The array of lasers could be an assembly of discreet diodes as in the Kodak Approval Digital Proofing System, or bar laser with a segmented light modulator as in the Kodak Newsetter or the Creo Trendsetter Plate Writer-Proofers. The device for transporting the substrate 110 could be a flatbed for rigid substrates and relative motion could be provided by moving either the laser array or the support stage. Drum systems utilizing flexible supports could also be considered, as well as laser arrays mounted in the suitable proximity for a moving web of substrate 110. There is no limitation to the number of addressable channels or lasers comprising the array, other than the practical limits of the devices themselves, and the ability or the CPU to deliver the information at the appropriate rate. More than one head could be employed simultaneously.

Modulation of the laser power on the plane of thin resist 130 to produce the desired ablative pattern could be accomplished by any means known if the art, such as binary exposure in the on or off mode as practiced in the laser system of this invention, or by pulse width modulation. The only requirement is that the power in the on mode be sufficient to cause ablation at the scan speed chosen.

The imagewise radiation supplied to thin resist layer 130 from any non-laser source such as a Xenon flash through a mask, or any other radiation source with a high enough intensity at the absorptive wavelengths of the light to heat converting substance to cause thermally induced ablation.

Light to Heat Converting Substance

The thin resist layer 130 of this invention absorbs a portion of the incident radiation by means of a light to heat converting substance in order to generate the heat required to exceed the ablation threshold given the light sources of IR lasers emit at wavelengths that are not capable of breaking bonds. The layers are thereby provided with radiation absorbing materials such dyes, pigments, carbon, or metals. The preferred heat substances absorb radiation in the near infrared between 700 and 1100 nm, and preferably between 800 and 840 nm. In addition, dyes that absorb in the visible spectrum between 400 and 700 nm in conjunction with YAG lasers could also be useful in this invention.

The preferred IR absorbing dyes of this invention are specified in commonly assigned U.S. Pat. No. 4,973,572 (DeBoer) and U.S. Pat. No. 5,578,416 (Tutt), or described in "Infrared Absorbing Dyes" (ed. Masaru Matsuoka, Plenum Press, 1990). Dye types useful for this invention include, but are not limited to, Cyanines, Squaryliums, Croconiums, Pyryliums, Quinones, Phthalocyanines and their metal complexes, Naphthalocyanines and their metal complexes, azo dyes, and Intermolecular Charge Transfer Complexes. Those skilled in the art will recognize that the radiation absorbing chromophores or this invention can be presented to the thin resist layer 130 as either monomolecular dyes or as pigment particles depending on the particular properties of the absorber, which may also include a carbon black, a metal nanoparticle, or a carbon nanotube. Other radiation absorbers useful for this invention in thin resist layer 130 are metals or inorganic materials such as chromium, nickel, titanium, molybdenum, tungsten, zirconium, alloys such as NiCr, MoCr, WTi, and the like, oxygen deficient oxides of metals such as aluminum or chromium oxides and the like, or a layered stack of materials that absorb radiation by virtue of their antireflection properties. The main criteria is that radiation-absorbing substance absorb laser light at the given wavelength of the imagewise radiation, at a high enough extinction for ablation of material from thin resist layer 130. The efficiency of this transfer is well known to depend on the laser fluence, spot size, beam overlap and other factors. Generally, the optical density of radiation-absorbing material as presented in the substrate-resist stack 10-12 should be at least 0.1 (20% of the light is absorbed).

The radiation absorbers of this invention may be present in the thin resist layer 130 as a monomolecular species dissolved in the organic binder of the thin resist layer 130, or as a separate layer within the confines of layer 130, or as multiple layers with intervening binders layers. The radiation absorbing substances of this invention can be applied to the thin resist layer 130 in a variety of methods known in the art, such as but not limited to, spin coating, spray coating, hopper coating, gravure, offset printing, flexography, ink jet deposition, supercritical $CO_2$, and the like, from a solution that may or may not include the binder material. Other methods of application include vacuum or vapor deposition.

Binder

For the purpose of this invention, the binder of thin resist layer 130 comprises at least a polymeric binder, or a monomeric glass, or a mixture thereof, and preferably also may include an additional gas-producing substance. It is further preferred that the polymeric binder be comprised either wholly or partially of a polymer that is thermally labile or prone to depolymerization at temperatures under 400° C. in order to enhance the efficiency and cleanliness of the ablative pattern.

The term "ablative removal" is broadly understood to be a heat-induced mass ejection of thin resist material 130, wherein at least a portion of a component of the resist is converted to a gaseous state. The material that is converted to gaseous state may be the resist material itself or may be some other component material of the thin resist layer 130 that thus serves as a propellant for ablative ejection. Ablative removal also includes fragmentation or particulate ejection, in which at least some portion of the donor material may not actually be converted to gaseous state, but is effectively fragmented and propelled by the conversion to vapor form of some heated component of the donor. It is therefore preferred that the resist layer comprises as much as possible, thermally labile materials.

To this end, a preferred class of polymer binders can be defined as polymers derived from a monomer CH=CXY, where X and Y independently are electronegative or resonance stabilized groups, and are further specified as the X and Y are among the groups: Halogen (when X is not equal to Y), —CN, —(C=O)OR, —(C=O)R, —(C=O)NR2, where R can independently be H, any alkyl, cycloalkyl or cycloalkenyl, aryl, —(OCH2CH2)$_z$CH3, —(OCH(CH3)CH2)$_z$ CH3, or any substituted alkyl or alkoxide group wherein at least one hydrogen atom is replaced with a halogen, silicon, or titanium atom. Mixtures of the above described polymers can also be included in thin resist layer 130.

Especially useful among polymers under this definition are the alkyl cyanoacrylate polymers wherein X is —CN and Y is (C=O)OR and the R group is methyl, ethyl or a copolymer thereof Polymers of this type are known to be useful as resins that are efficiently ablated as shown in the following U.S. Pat. No. 5,468,591 (Pearce et al.), U.S. Pat. No. 5,858,607 (Burberry et al.), and U.S. Pat. No. 6,165,671 (Weidner et al.). Cyanoacrylates have also been cited as useful as electron beam resists, Helbert et al.; Radiation Degradation of α-Substituted Acrylate Polymers and Copolymers; Applied Polymer Science; Vol. 21, 1977, pp. 797-807, and as a photoablative resist for high-energy UV radiation by Hogan et al.; Laser Photoablation of Spin-on-Glass and Poly(Ethyl Cyanoacrylate) Photoresist; Applied Surface Science 36 (1989), pp. 343-349.

It is anticipated that the physical properties of the cyanoacrylate polymers may need to be modified, particularly to provide improved adhesion to the substrate 110. Such improvements have been applied to their uses as electron beam resists, and include modifying the alkyl groups of the cyanacrylate esters, for example to produce a 3-trimethylsilylpropyl 2-cyanoacrylate as taught by in U.S. Pat. No. 5,359, 101 (Woods et al.). A widely practiced method for modifying polymer properties of this class involve copolymerization with a wide variety of vinyl monomers to improve adhesion, and molecular weight stability, as in EP Patent No. 0343603, U.S. Pat. No. 4,686,168 (Fujii et al.), and JP Patent No. 7-056341. Useful compositions include cyanoacyrlate copolymers with acrylates, methacrylates, fluoroacrylates and fluoromethacrylates, vinyl esters, vinyl ethers, vinyl ketones, styrene, a-methylstyrene, butadiene, isoprene, methacrylamides, acrylamides, acrylonitrile, and methacrylonitrile, and mixtures thereof In addition, comonomers comprising radiation crosslinkable groups, such as cinnamate groups might be included in order to improve etch resistance after the initial ablative patterning of thin resist 130.

Cyanoacrylate polymers are known to exhibit molecular weight instability when dissolved in various solvents (Woods et al.; Vapour deposition of poly(alkyl-2-cyanacrylate) resist coatings: a new electron-beam/deep-ultra-violet photoresist technology; Polymer 1989, Vol. 30, pp. 1091-1098), in that they will equilibrate to a lower molecular weight from a higher molecular weight. In most cases as practiced in this invention, a useful degree of polymerization is almost always maintained, and usually does not degrade to less than 10,000 (Wt average), and typically resides at about 30,000 in solution. This behavior is particularly troublesome for electron beam or X-ray lithography that depends on well defined and consistent solution behavior in order to control the development step. For the purposes of this invention, however, no favored molecular weight is specified as long as a practical ablation threshold energy is provided. Those knowledgeable in the art will recognize that while ablation efficiency is most likely favored by low molecular weights, other physical and chemical properties such as adhesion might be favored by higher molecular weights, and that a balance much be struck depending on the demands of the materials and processes used.

Other thermally labile and otherwise useful polymers comprising the binder of thin resist layer 130 include nitrocellulose, copolymers of maleic anhydride including methylvinylether maleic anhydride and styrene maleic anhydride, an alpha-substituted aliphatic polycarbonate, polyketones, polyalkenesufones, alpha-methyl styrene, and a silicone, and their mixtures with polymers of the general structure CH=CXY where X and Y are independently electronegative and resonance stabilized groups.

The polymeric binders of thin resist layer 130, alone or in combination with polymers already cited, may include polymers known to provide resist properties in lithographic processes, such as Shipley G-Line or S1800 series from Rohm and Haas, Marlborough, Mass., and including materials such as polymethacrylates and acrylates, polystyrene and copolymers with butadiene, acrylates and methacrylates, acrylonitrile, polyesters, polyamides, polyimides, polyvinylchlorides and copolymers with vinyl acetate, poly vinyl esters, polyurethanes, polyvinyl acetyls and butyrals, epoxides, polyimides, Novolac resins, polyvinyl phenol resins, and the like.

Polymeric resins formed in vacuum deposition processes might also be considered as useful binders for the resist layer 130, as for example, poly p-xylene derived from pyrolyzed [2.2] paracyclophane, (Trade name is Parylene, Union Carbide), a resin derived from divinylsiloxane bis(benzocyclobutene) (Cyclotene Resins, Dow Chemical), and resins formed by glow discharge plasma polymerization such as poly alkenes and poly fluoroalkanes. Such vacuum deposited resins might be co-deposited with radiation absorbing materials such as dyes and metals, or applied in separate layers in the confines of resist layer 130.

In addition to polymeric materials, useful binder elements for resist layer 130 include monomeric glasses, defined in U.S. Pat. No. 5,891,602 (Neuman) as a non-polymeric organic material with a glassy state having a glass transition temperature of greater than 25 deg C., capable of forming an amorphous glass in said resist layer, and including the materials claimed and specified therein. Additionally useful monomeric and oligomeric glasses are specified in copending commonly-assigned U.S. patent application Ser. No. 11/240,964, and include resins as described in previously cited U.S. Pat. No. 6,165,671, such as hydrogenated and partially hydrogenated rosin esters and similar rosin esters. Commercially available materials include the glycerol ester of hydrogenated wood rosin, such as Staybellite Ester 10 (Hercules), the glycerol ester of hydrogenated rosin, such as Foral 85 (Hercules) and the pentaerythritol ester of modified rosin, such as Pentalyn 344 (Hercules). The amorphous organic solids of layer 130 may also be oligomeric resins with a molecular weight of less than about 4000 such as the polyester tone 260. The monomeric glasses add organic bulk without adding unnecessary covalent bonds and represent chemical species more likely to be volatilized by the ablation than many typical resins.

Thin resist layer 130 may also be partially comprised of monomeric or oligomeric materials capable of release a gas when subject to the elevated temperature of the ablated regions and will thus assist in the mass ejection of material from said ablated pattern. Such materials include tetrazoles and triazoles and their amino derivatives, as for example, 3-amino tetrazole, sodium azide, used as an automotive air bag propellant, azo compounds such as azo-bis-isobutyrylnitrile, azido-oxetane polymers and oligomers such as "polybamo" (1,1'-(Methylenebis(oxy))bis(2,2-dinitropropane)) and the like.

Any of the layers of thin resist element 130 may include, in addition to the materials already disclosed, surface active agents necessary as coating aids and used for the modification of surface properties, hardeners, adhesion promoting agents, and the like, necessary for the physical integrity during the process steps. Visible yes absorbing at wavelengths other than the imagewise radiation may also be added to any of the layers of thin resist 130 to provide process visualization.

The thin resist layer 130 can be from 0.1 to 10 microns thick, and preferably is between 0.25 to 1.5 microns.

Immediately following the thermally induced imagewise ablative pattern formation, a small amount of residual organic material may be remaining at the bottom of an ablated region. This residual material may be residual resin or other organic thermal decomposition products, and may need to be removed before the final process that will be applied to thin resist layer 130. This material can be easily removed by any number of de-scumming operations used in conventional lithography including oxygen plasma, either in a vacuum or at atmospheric pressure. Such operations are typically done at short times and low powers so as to not remove significant amounts of resist in non-ablated areas, but sufficient to clean the intended ablated region. In addition, the oxygen cleaning step may also provide a steeper wall profile in the thin resist 130.

Figure 2:
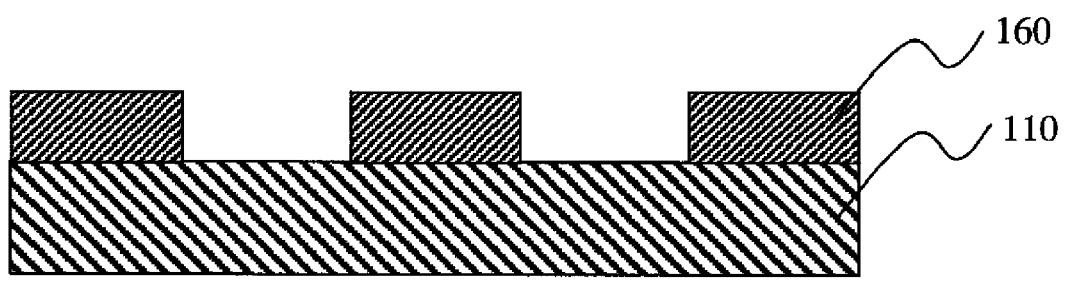
FIG. 2 is a cross section side view of FIG. 1 after the thin resist layer has been patterned.

In either of the two previously preferred embodiments, a patterned resist layer 160 on substrate 110 is the result, as shown in FIG. 2.

Figure 3:
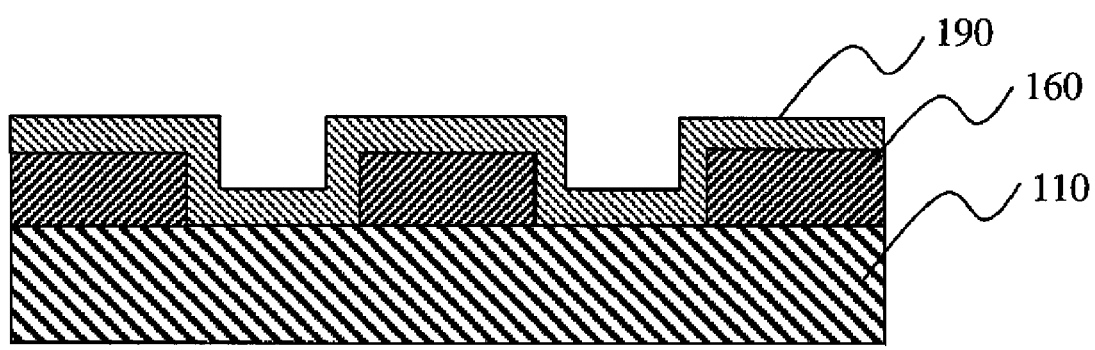
FIG. 3 is a cross-sectional side view of FIG. 2 that has uniformly been coated with metal nanoparticles.

A solution of nanoparticles is then applied to the patterned resist and substrate to give a uniform coating. The coating will cover both opening in the resist where the substrate 110 is revealed as well as the patterned resist 160. This is depicted in FIG. 3 where nanoparticles 190 is shown.

The nanoparticles can be applied any method for the application of a liquid coating. Some example methods include hopper coating, spin coating, knife coating, inkjet printing, gravure printing, offset printing, or flexography. It will be recognized that these are representative methods and the invention is not limited to these methods of application.

The nanoparticles can be any metal or semimetal which can be made to form nanoparticles and are dispersible in a solvent. The main criterion for choosing a solvent for the nanoparticles is that the patterned resist is not soluble in the solvent for the nanoparticles.

Examples of metals which may be used to form nanoparticles, but are not limited to are: silver, gold, and nickel. The nanoparticles may also be formed as a mixture or two or more metals, for example as an alloy or as a core shell particle wherein one metal is the core and another surrounds the outside.

The nanoparticles are small enough that the temperatures to melt them have been reduced. In many case the temperatures are hundreds of degrees below the pure materials. To allow good conduction, all that is typically necessary is to heat the nanoparticles which causes sintering and melting and concomitant increase in the conductivity.

The nanoparticles typically stabilized with an organic shell which allows the dispersement in solvent and stabilization to spontaneous sintering. The organic coating is selected for optimal thermal stabilization, low temperature sintering, desired solvent dispersement. Upon heating, the organic coating is typically released. This release melting and sintering of the particles and thereby intimate contact between the particles and hence increased conduction.

A preferred embodiment is silver nanoparticles formed with a dodecylamine shell dispersed in cyclohexane. The dodecylamine binds moderately to the silver nanoparticles allowing stable dispersement in cyclohexane. The resists to be used are chosen to not be soluble in cyclohexane.

Figure 4:
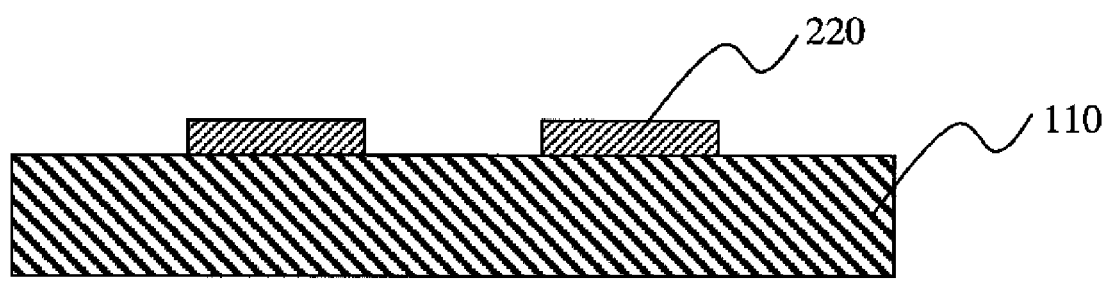
FIG. 4 is a cross-sectional side view of FIG. 3 after the thin resist layer and overlying nanoparticles have been removed.

In the next step, shown in FIG. 4, the resist is removed with a solvent. The solvent for the resist is chosen to not be a solvent for the nanoparticles. In the event that the solvent is a solvent for the nanoparticles the nanoparticles will be removed everywhere.

A typical solvent for resist is acetone. The nanoparticles should, in this case, not be soluble in acetone. The dodecyl group is an example of an organic coating which typically confers solubility of the nanoparticles in alkanes but not in ketones such as acetone.

The nanoparticles are porous and have low cohesive strength so that the solvent can penetrate the nanoparticle layer directly and solubilize the resist. The cohesive forces or the nanoparticles are small and unlike pure metal coatings will not tend to bridge gaps and instead "tear" cleanly, allowing good edge definition. Areas that do not contain resist are not solubilized and the surface adhesion retains the nanoparticles as a good coating. What is left is patterned nanoparticles 220 on the substrate.

In the final step, heating of the nanoparticles causes melting or sintering to coalesce the nanoparticles and thereby increase the conductivity. The heating can be conducted by any means that raises the temperature above the sintering temperature. Example methods include but are not limited to oven heating, hot plates, radiant heaters, thermal conduction, hot air, microwave, or photothermal.

Figure 5:
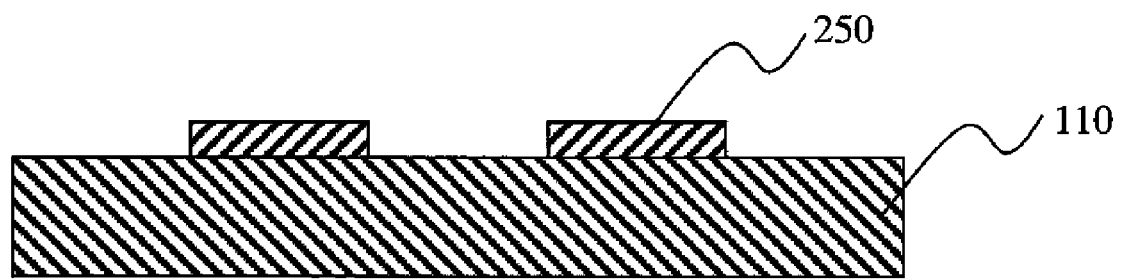
FIG. 5 is a cross-sectional side view of FIG. 4 after sintering the metal nanoparticles.

In FIG. 5, a metallic pattern 250 forms a pattern on the substrate 110. This pattern is the desired wiring for a circuit on the substrate 110.

EXAMPLES PREPARATION OF Ag(0) NANOPARTICLES DISPERSION

Added 8 l of cyclohexane/68 g of silver acetate/740 g of dodecylamine to a 22 liter, 3 necks, round reaction flask equipped with a stir rod, cold water condenser and an addition funnel containing 2 l of cyclohexane/44 g of phenylhydrazine/100 ml toluene. After dissolving all silver acetate in solution, added chemicals in addition funnel dropwise to the reaction flask. The mixture was stirred at 60° C. for 1 hour before being cooled down to room temperature. Subsequently, 2 l of acetone was added. The dispersion was concentrated via vacuum evaporation at 45° C. To the resulting concentrated reaction mixture was added 101 g of 50/50 methanol/acetone to precipitate the silver nanoparticles with yield of 48.81 g. The Ag(0) nanoparticles dispersion was made by dissolving the silver nanoparticles in cyclohexane to obtain a 10% by weight solution.

Example 1

A glass substrate is spin coated at 1000 rpm with a thermal resist solution of 7.5 wt % Poly(methyl-co-ethyl)cyanoacrylate, 1.0 wt % IR dye (1) 0.05% Fluorocarbon surfactant FC-431 (3M Corp) in 50/50 acetonitrile/cyclopentanone. The solution was subjected to a laser ablation using a laser system of a non-coherent infrared diode laser bar at 808 nm (+/−10 nm) whose beam is divided into 256 separate addressable channels modulated by a spatial light modulator at 5 micron intervals across the beam's width, as described in U.S. Patent Application Publication No. 2005/0266172 (Kay et al.), which is incorporated by reference. The beam intensity distribution in the fast scan direction is a Gaussian whose 1/e2 diameter value is 3.6 micrometers. Peak to peak distance in the fast scan direction was limited by the modulation scheme to 5 microns for the examples of this invention yielding a minimum ablated spot at the film plane of about 5 microns maximum representing 1 pixel in any image rendition. The beam was scanned across the sample by a two axis movable stage that held the sample. Exposure occurred as the fast scan axis movable stage ran at speeds between 1.0 and 0.1 meter per second. The powers available on laser system II were between 11 and 55 milliwatts per channel corresponding to a total exposure range of between 0.22 and 11 J/cm2, although the powers and exposures useful for this invention are not limited to these ranges. The slow scan axis movable stage increments the sample a set distance in preparation for another fast scan motion. This sequence continues until the total desired area is exposed.

A solution of the silver nanoparticles was spin coated onto the patterned substrate at 1000 RPM. The coated substrate was then placed on an acetone bath in a Bransonic 12 sonic bath (Branson Instruments, Shelton, Conn.) and the solution and substrate sonicated for 15 seconds whereupon all of the thermal resist dissolved and all overlying nanoparticles sloughed off. The nanoparticles on the glass were unaffected and remained.

The substrate was then heated to 175 for 10 minutes on a hot plate whereupon the silver nanoparticle sintered; visually changing from a reddish brown to a metallic luster.

The patterns generated were highly conductive and gaps of 4 microns could be achieved.

Example 2

A glass substrate was spin coated with photoresist (S1805 photoresist, Rohm and Haas, Marlborough, Mass.) and exposed to a UV pattern of light at From an Ar-ion laser operating at 351.1 nm, modulated by an acoustooptic modulator with a galvanometer and a mechanical stage providing the X and Y locations respectively for exposure. The exposure was a 10 micrometer spot with approximately 20 mj/cm2 and a dwell time of 9 microseconds. The photoresist was developed in a conventional manner of 1 minute using MF319 developer (Rohm and Haas, Marlborough, Mass.) to give a photoresist pattern on a glass substrate.

A solution of silver nanoparticles was spin coated onto the patterned substrate at 1000 RPM. The coated substrate was then placed on an acetone bath in a Bransonic 12 sonic bath (Branson Instruments, Shelton, Conn.) and the solution and substrate sonicated for 15 seconds whereupon all of the photoresist dissolved and all overlying nanoparticles sloughed off. The nanoparticles on the glass were unaffected and remained.

The substrate was then heated to 175 for 10 minutes on a hot plate whereupon the silver nanoparticle sintered; visually changing from a reddish brown to a metallic luster. The patterns generated were highly conductive and 10 micron lines were well resolved.

The invention has been described in detail with particular reference to certain preferred embodiments thereof, but it will be understood that variations and modifications can be effected within the scope of the invention.

PARTS LIST 110 substrate
130 thin resist
160 patterned resist
190 nanoparticles
220 patterned nanoparticles
250 metallic pattern

The invention claimed is:

1. A method of making a metallic pattern comprising:
   depositing a layer of photoresist on a substrate;
   forming a pattern of opening in said photoresist;
   depositing a layer of metal nanoparticles on said photoresist and on said pattern;
   removing said photoresist and overlying metal nanoparticles on said photoresist; and
   sintering the remaining said nanoparticles to form a metallic pattern.

2. The method of claim 1 wherein said metal nanoparticles are silver.

3. The method of claim 1 wherein said metal nanoparticles are gold.

4. The method of claim 1 wherein said deposition of said metal nanoparticles is by spin coating.

5. The method of claim 1 wherein said deposition of said metal nanoparticles is by spray coating.

6. The method of claim 1 wherein said deposition of said metal nanoparticles is by inkjet printing.

7. The method of claim 1 wherein said deposition of said metal nanoparticles is by gravure printing.

8. The method of claim 1 wherein said deposition of said metal nanoparticles is by offset printing.

9. The method of claim 1 wherein said deposition of said metal nanoparticles is by knife coating.

10. The method of claim 1 wherein said deposition of said metal nanoparticles is by flexography.

11. The method of claim 1 wherein said deposition of said metal nanoparticles is by hopper coating.

12. The method of claim 1 wherein said pattern is formed by ultraviolet or visible light projected through a mask onto said photoresist followed by development.

13. The method claim 1 further comprising:
scanning and modulating ultraviolet or visible laser onto said layer of photoresist;
developing said layer of photoresist.

14. A method of making a metallic pattern comprising:
depositing a layer of thermal resist on a substrate;
forming a pattern of opening in said thermal resist;
depositing a layer of metal nanoparticles on said thermal resist and pattern;
removing remaining thermal resist and overlying metal nanoparticles on said remaining thermal resist; and
sintering remaining said nanoparticles to form a metallic pattern.

* * * * *